United States Patent
Gupta et al.

(10) Patent No.: US 12,153,083 B2
(45) Date of Patent: Nov. 26, 2024

(54) TEST FIXTURE FOR PRINTED CIRCUIT BOARD COMPONENTS

(71) Applicant: Aptiv Technologies AG, Schaffhausen (CH)

(72) Inventors: Biswadeep Das Gupta, Noblesville, IN (US); Syed An Nazmus Saqueb, Westfield, IN (US); Ridhwan Khalid Mirza, Kokomo, IN (US); Sophie Macfarland, Carmel, IN (US)

(73) Assignee: Aptiv Technologies AG, Schaffhausen (CH)

( * ) Notice: Subject to any disclaimer, the term of this patent is extended or adjusted under 35 U.S.C. 154(b) by 0 days.

(21) Appl. No.: 18/306,214

(22) Filed: Apr. 24, 2023

(65) Prior Publication Data

US 2023/0258708 A1    Aug. 17, 2023

Related U.S. Application Data

(63) Continuation of application No. 17/656,205, filed on Mar. 23, 2022, now Pat. No. 11,719,740.
(Continued)

(51) Int. Cl.
*G01R 31/28*    (2006.01)
*G01R 1/02*    (2006.01)
(Continued)

(52) U.S. Cl.
CPC .............. *G01R 31/2808* (2013.01)

(58) Field of Classification Search
CPC ........ G01R 31/02; G01R 31/20; G01R 31/28; G01R 31/2808; G01R 1/02; G01R 1/04;
(Continued)

(56) References Cited

U.S. PATENT DOCUMENTS

2013/0335110 A1* 12/2013 Gauthier .............. G01R 1/0408
                                                                324/750.16
2017/0227598 A1* 8/2017 Lam ...................... G01R 1/045

FOREIGN PATENT DOCUMENTS

CN     212497314 U    2/2021
CN     115411481 A    11/2022

OTHER PUBLICATIONS

"Extended European Search Report", EP Application No. 22197714.3, Apr. 17, 2023, 6 pages.
(Continued)

*Primary Examiner* — Neel D Shah
(74) *Attorney, Agent, or Firm* — Harness, Dickey & Pierce, P.L.C.

(57) ABSTRACT

A test fixture for PCB components is described herein. The test fixture comprises a shim with an aperture configured to direct RF energy from a component of a PCB, via an end of the PCB, and to a top clamp of the test fixture. The end of the PCB may correspond to a cut line of a destructive test. The test fixture also comprises the top clamp with a test port and a taper configured to direct the RF energy from the aperture to the test port. The test fixture also comprises a bottom clamp attached to the top clamp to retain the PCB between the top and bottom clamps for testing. The test fixture allows for quick mounting of the PCB and testing of the component without modifying a design of the PCB or requiring specific drilling of the PCB.

27 Claims, 10 Drawing Sheets

Related U.S. Application Data

(60) Provisional application No. 63/265,029, filed on Dec. 6, 2021.

(51) Int. Cl.
    *G01R 1/04*     (2006.01)
    *G01R 1/067*     (2006.01)
    *G01R 1/073*     (2006.01)
    *G01R 31/20*     (2006.01)

(58) Field of Classification Search
    CPC ...... G01R 1/0425; G01R 1/067; G01R 1/073; G01R 1/20; G01R 29/08
    See application file for complete search history.

(56) References Cited

OTHER PUBLICATIONS

Li, et al., "Broadband Transition Between Substrate Integrated Waveguide and Rectangular Waveguide Based on Ridged Steps", IEICE Electronics Express, vol. 11, No. 13, 2014, 7 pages.

Luis, et al., "Full-Band Air-Filled Waveguide-to-Substrate Integrated Waveguide (SIW) Direct Transition", IEEE Microwave and Wireless Components Letters, vol. 25, No. 2, Feb. 2015, pp. 79-81.

* cited by examiner

TEST FIXTURE FOR PRINTED CIRCUIT BOARD COMPONENTS

CROSS-REFERENCE TO RELATED APPLICATIONS

This application is a continuation of U.S. patent application Ser. No. 17/656,205, filed Mar. 23, 2022, which claims the benefit of U.S. Provisional Patent Application No. 63/265,029, filed Dec. 6, 2021, the disclosures of which are hereby incorporated by reference in their entireties herein.

BACKGROUND

Many printed circuit boards (PCBs) used for radio frequency (RF) signal propagation (e.g., RADAR) are hybrid PCBs where components such as monolithic microwave integrated circuits (MMICs), substrate integrated waveguides (SIWs), matching circuits, microstrips, and/or ball grid array (BGA) to SIW transitions, are integrated into a single layer (e.g., an antenna substrate layer). Designing PCBs in such a way allows the components to operate more effectively and efficiently (e.g., achieve higher signal-to-noise ratios). However, troubleshooting and failure mode analysis of PCBs often requires isolation of components, which can be difficult on hybrid PCBs due to an inherent difficulty in separating and/or isolating their various components from each other.

SUMMARY

This document is directed to a test fixture for PCB components and PCBs configured for testing using the test fixture. The test fixture is configured to test at least one component of a PCB. The PCB may be a portion of a parent PCB that has been cut for testing.

In one implementation, the test fixture comprises a shim that provides an end having a thickness that corresponds to a thickness of the PCB proximal an end of the PCB. The end of the shim provides an aperture that is configured to direct RF energy from the component, via the end of the PCB, and to a top clamp of the test fixture. The test fixture also comprises the top clamp that provides a standard test port of the test fixture that is configured to test the component and a taper that is configured to direct the RF energy from the aperture of the shim and to the standard test port. The test fixture also comprises a bottom clamp configured to be attached to the top clamp to retain the PCB between the top clamp and the bottom clamp for testing.

In another implementation, the test fixture comprises a top clamp that provides a contact leg configured to contact a component. The top clamp also comprises a pyramidal probe that is connected to the contact leg and configured to provide RF energy from the component, via the contact leg and the pyramidal probe, to a standard test port of the test fixture. The test fixture also comprises a bottom clamp configured to be attached to the top clamp to retain the PCB between the top clamp and the bottom clamp for testing. The bottom clamp provides the standard test port and a shelf for supporting the PCB in the test fixture.

This Summary introduces simplified concepts for a test fixture for PCB components that are further described in the Detailed Description and Drawings. This Summary is not intended to identify essential features of the claimed subject matter, nor is it intended for use in determining the scope of the claimed subject matter.

BRIEF DESCRIPTION OF THE DRAWINGS

A test fixture for PCB components, components thereof, and aspects of a PCB configured for testing using the test fixture are described with reference to the following drawings that use some of the same numbers throughout to reference like or examples of like features and components.

DETAILED DESCRIPTION

Overview

RF PCBs are increasingly being developed and manufactured as hybrid PCBs that integrate multiple components (e.g., MMICs, SIWs, microstrips) on a single layer. While doing so allows the components to operate more effectively and efficiently, determining correct failure modes may be difficult due to the integration.

For example, conventional techniques may be unable to diagnose whether a MMIC or an antenna/SIW is causing a poor or failed RF signal. Furthermore, conventional techniques often require modifications to the components or the PCBs (e.g., modifying an SIW or adding an additional waveguide or drilling a PCB to mount for testing). Such modifications may not only add cost and complexity to fabrication and testing, but they may also decrease functionality of the devices themselves.

A test fixture for PCB components is described herein. In an implementation, the test fixture comprises a shim with an aperture configured to direct RF energy from a component of a PCB, via an end of the PCB, and to a top clamp of the test fixture. The end of the PCB may correspond to a cut line of a destructive test. The test fixture also comprises the top clamp with a test port and a taper configured to direct the RF energy from the aperture to the test port. The test fixture also comprises a bottom clamp attached to the top clamp to retain the PCB between the top and bottom clamps for testing.

In another implementation, the test fixture comprises a top clamp that provides a contact leg configured to contact a component. The top clamp also comprises a pyramidal probe that is connected to the contact leg and configured to provide RF energy from the component, via the contact leg and the pyramidal probe, to a standard test port of the test fixture. The test fixture also comprises a bottom clamp configured to be attached to the top clamp to retain the PCB between the top clamp and the bottom clamp for testing. The bottom clamp provides the standard test port and a shelf for supporting the PCB in the test fixture.

The test fixture allows for quick mounting of the PCB and testing of the component. Furthermore, the test fixture allows for testing other components (e.g., another component of the PCB or a component opposite a cut line of a parent PCB). By enabling such features, the test fixture can provide for testing of individual components without requiring specific drilling of the PCB or modifying a design of a PCB (e.g., the parent PCB).

Example Environment

Figure 1:
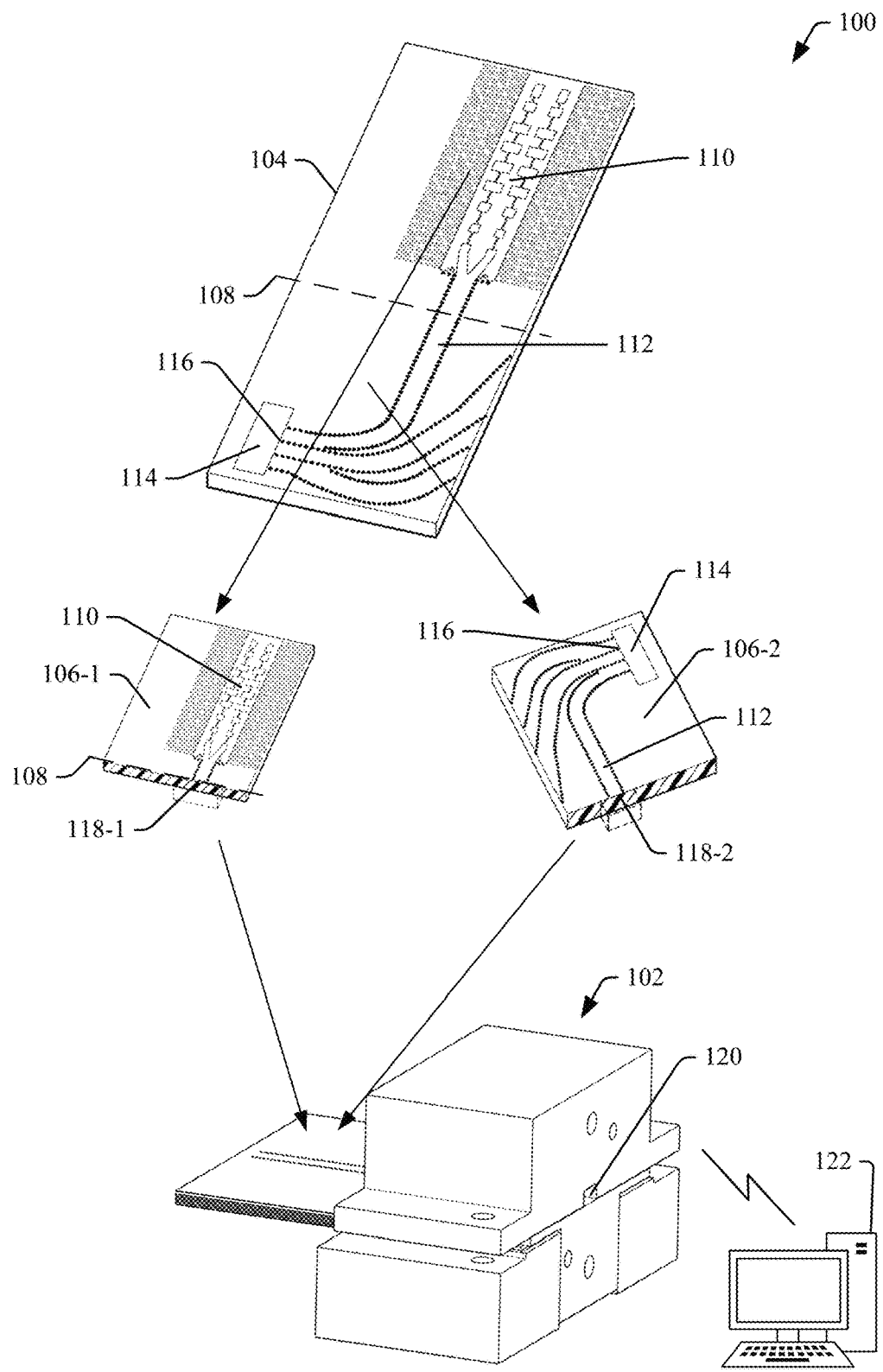
FIG. 1 illustrates, in accordance with this disclosure, an example environment where a test fixture for PCB components may be implemented.

FIG. 1 illustrates an example environment 100 where a test fixture 102 for PCB components may be implemented. The example environment 100 includes a parent PCB 104 that includes components to test (e.g., RADAR components, RF transmission components). The parent PCB 104 may be a hybrid PCB that may have failed, not be working properly, under development, or any other scenario that may necessitate testing of the components thereon.

To perform the testing, the parent PCB 104 may be cut, split, divided, separated, or otherwise modified to create at least one PCB 106 for testing (e.g., PCB 106-1 and PCB 106-2). Because the parent PCB 104 is a hybrid, the test is a destructive test to effectively test various components thereon. That is, the parent PCB 104 will not function again as designed once the PCB 106 is created.

In the example environment 100, the parent PCB 104 is cut along a cut line 108. The cut line 108 is illustrated as between an antenna 110 and an SIW 112 that propagates signals generated by a MMIC 114. The signals from the MMIC 114 go through an RF circuit 116 (e.g., a BGA to SIW transition). As such, the PCB 106-1 includes the antenna 110 to be tested and the PCB 106-2 includes the MMIC 114 (and RF circuit 116) to be tested.

The PCB 106 has a clamp interface 118 along the cut line 108 (e.g., clamp interface 118-1 for PCB 106-1 and clamp interface 118-2 for PCB 106-2). The clamp interface 118 is on an edge of the PCB 106 that corresponds to the cut line 108. In the example environment 100, the clamp interfaces 118 correspond to the connection between the SIW 112 and the antenna 110.

The PCB 106 (one or both individually) may then be placed into the test fixture 102 for testing the components. The PCB 106 is oriented in the test fixture 102 according to a location of its clamp interface 118. The fixture has a test port 120 configured to interface with a computing system 122 to evaluate one or more parameters of the respective components. The test port 120 may be any non-standard or standard port (e.g., a waveguide interface). The computing system 122 may be any system (e.g., smart device, computer, laptop, desktop, server) configured to use the test port 120 to analyze one or more parameters. For example, the computing system 122 may have a sensor configured to mate with the test port 120 and software configured to evaluate performance of one or more components of the PCB 106 using the sensor.

Example Test Fixture

Figure 2:
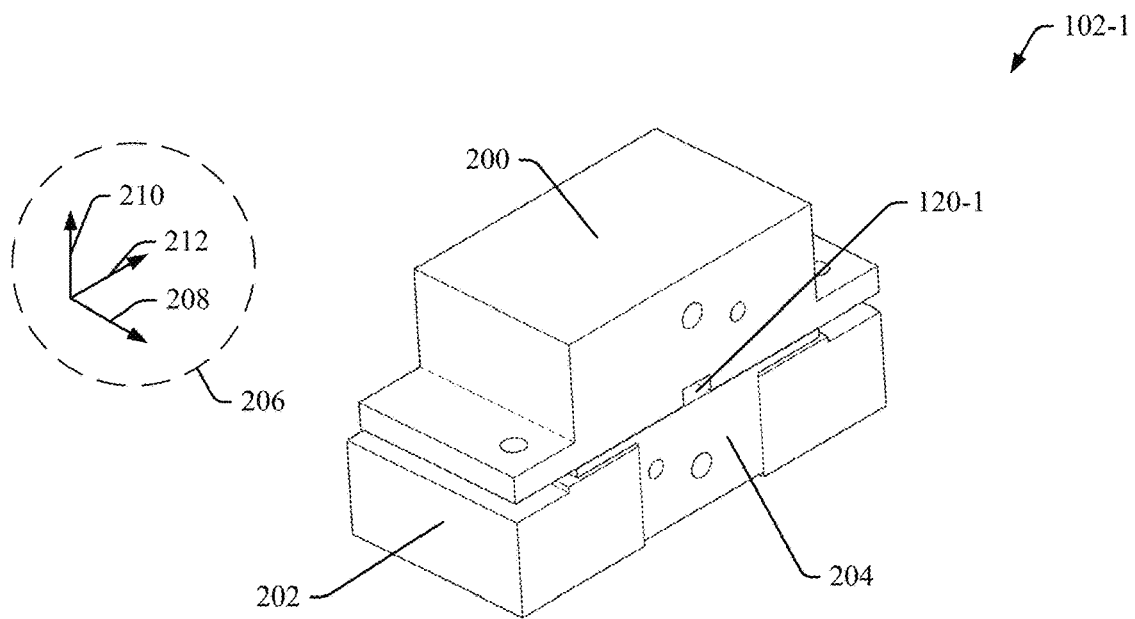
FIG. 2 illustrates, in accordance with this disclosure, an example test fixture for PCB components.
Figure 2:
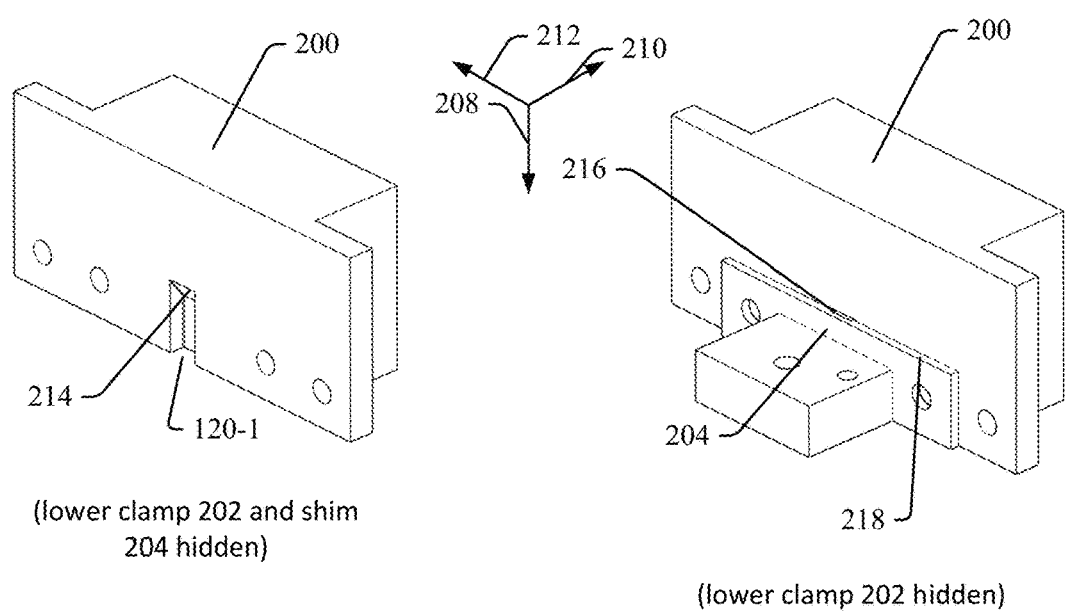

FIG. 2 illustrates an example of the test fixture 102 of FIG. 1 (e.g., test fixture 102-1). The test fixture 102-1 may be configured to test a number of components (e.g., antennas, SIWs, MMICs, BGA-SIW transitions). The test fixture 102-1 includes a top clamp 200, a bottom clamp 202, and a shim 204. For reference, a coordinate system 206 is shown. The coordinate system 206 comprises a front/rear axis 208, a top/bottom axis 210, and a left/right axis 212. The arrows in the coordinate system 206 designate rear, right, and top directions, respectively.

The top clamp 200 includes the test port 120 (e.g., test port 120-1) facing a rear side of the test fixture 102-1. In other words, the test port 120-1 is parallel to a normal axis of the end of the PCB. The top clamp 200 also includes a taper 214 connecting a bottom side of the top clamp 200 to the test port 120-1. A portion of the taper 214 interfaces with an aperture 216 of the shim 204.

The aperture 216 also interfaces with the clamp interface 118 (e.g., clamp interface 118-1 or clamp interface 118-2). Specifically, the PCB 106 (e.g., PCB 106-1 or PCB 106-2) may be aligned in the left/right axis 212 such that the clamp interface 118-1 or 118-2 is within a length of the aperture 216. When the PCB 106-1 or 106-2 is placed in the test fixture 102-1, signals may be transmitted between the clamp interface 118-1 or 118-2 and the test port 120-1 via the aperture 216 of the shim 204 and the taper 214 of the top clamp 200.

The shim 204 is located between the top clamp 200 and the bottom clamp 202. The shim 204 may be attached to either the top clamp 200 or the bottom clamp 202, be a part of the top clamp 200 or the bottom clamp 202, or be held between the top clamp 200 and the bottom clamp 202 when the top clamp 200 is secured to the bottom clamp 202 (e.g., via screws, bolts, nuts, press fits, clamps, latches, guides, actuators).

The shim 204 provides a locating end 218 that locates the PCB 106-1 or 106-2 in the front/rear axis 208. Specifically, the PCB 106-1 or 106-2 is inserted such that the end with the clamp interface 118-1 or 118-2 is flush with the locating end 218. The shim 204 is located in the top/bottom axis 210 and the left/right axis 212 such that the aperture 216 is aligned with the taper 214 of the top clamp 200. The alignment is such that the aperture 216 is centered relative to the taper 214 in the left/right axis 212 and such that the taper covers the aperture 216 in the top/bottom axis 210.

The locating end 218 has a thickness that corresponds to a thickness of the PCB 106-1 or 106-2. Thus, without the PCB 106-1 or 106-2 inserted, a gap between the bottom face of the top clamp 200 and the top face of the bottom clamp 202 is substantially the thickness of the PCB 106-1 or 106-2. The shim 204 may be different thicknesses (more specifically the locating end 218) to accommodate different thicknesses of the PCB 106-1 or 106-2.

In some implementations, a gasket material may be disposed between the shim 204 and the bottom clamp 202 and/or between the PCB 106-1 or 106-2 and the bottom clamp 202. For example, the gasket material may be a compressible material (e.g., rubber, urethane, plastic). The gasket material may ensure a secure hold of the PCB 106-1 or 106-2 and/or accept variation in the thickness of the PCB 106-1 or 106-2 or the shim 204.

Example Components

Figure 3:
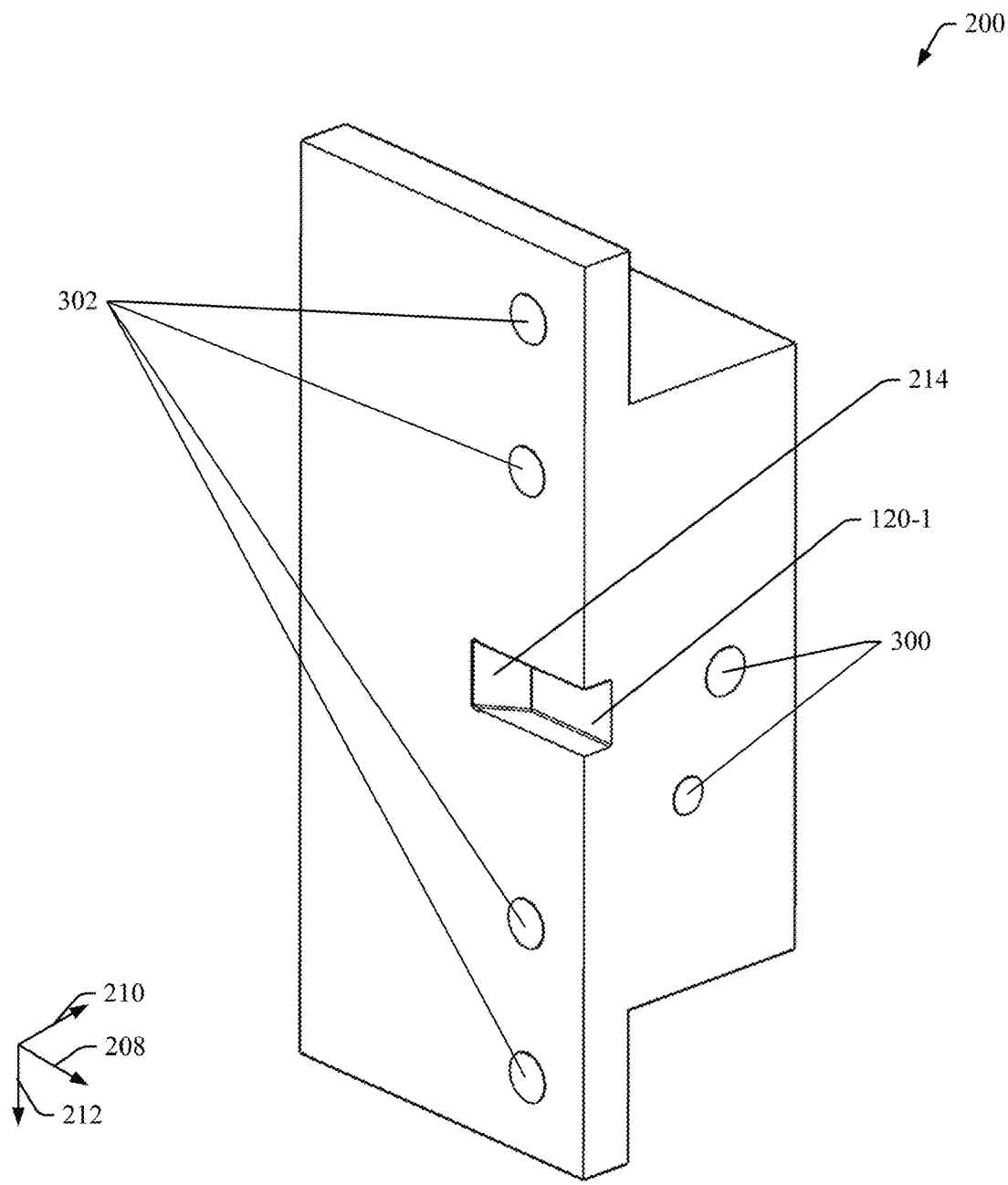
FIG. 3 illustrates, in accordance with this disclosure, an example top clamp of the test fixture of FIG. 2.

FIG. 3 illustrates an example of the top clamp 200 of FIG. 2. The top clamp 200 may be made of any conductive material (e.g., metal, conductive plastic) and may be formed and/or machined.

The top clamp 200 includes the test port 120-1 and the taper 214. As discussed above, the taper 214 connects the bottom face of the top clamp 200 to the test port 120-1. A length of the taper 214 (e.g., a length of the slanted face between the bottom face and the test port 120-1) may be configured for a bandwidth of the component(s) under test. The test port 120-1 may be a rectangular standard test port (e.g., a WR12 waveguide interface, WRXX waveguide interface).

Because the test port 120-1 has a fixed height (e.g., a standard height), the length of the taper 214 defines an angle of the taper 214 (e.g., relative to a normal axis of a major plane of the PCB 106-1, 106-2). A steeper angle (e.g., a shorter taper) may be configured for narrow band impedance matching while a slacker angle (e.g., a longer taper) may be configured for wide band impedance matching.

The top clamp 200 includes sensor features 300 and assembly features 302. The sensor features 300 are configured to secure a sensor or other device to the top clamp 200 (and thus, the test fixture 102-1) enabling the sensor to utilize the test port 120-1 for testing of the components. The sensor features 300 may include holes, slots, threads, pins, and/or latches. The assembly features 302 are configured to secure the top clamp 200, the bottom clamp 202, and the shim 204 together as the test fixture 102-1. The assembly features 302 may include holes, slots, threads, pins, and/or latches.

Figure 4:
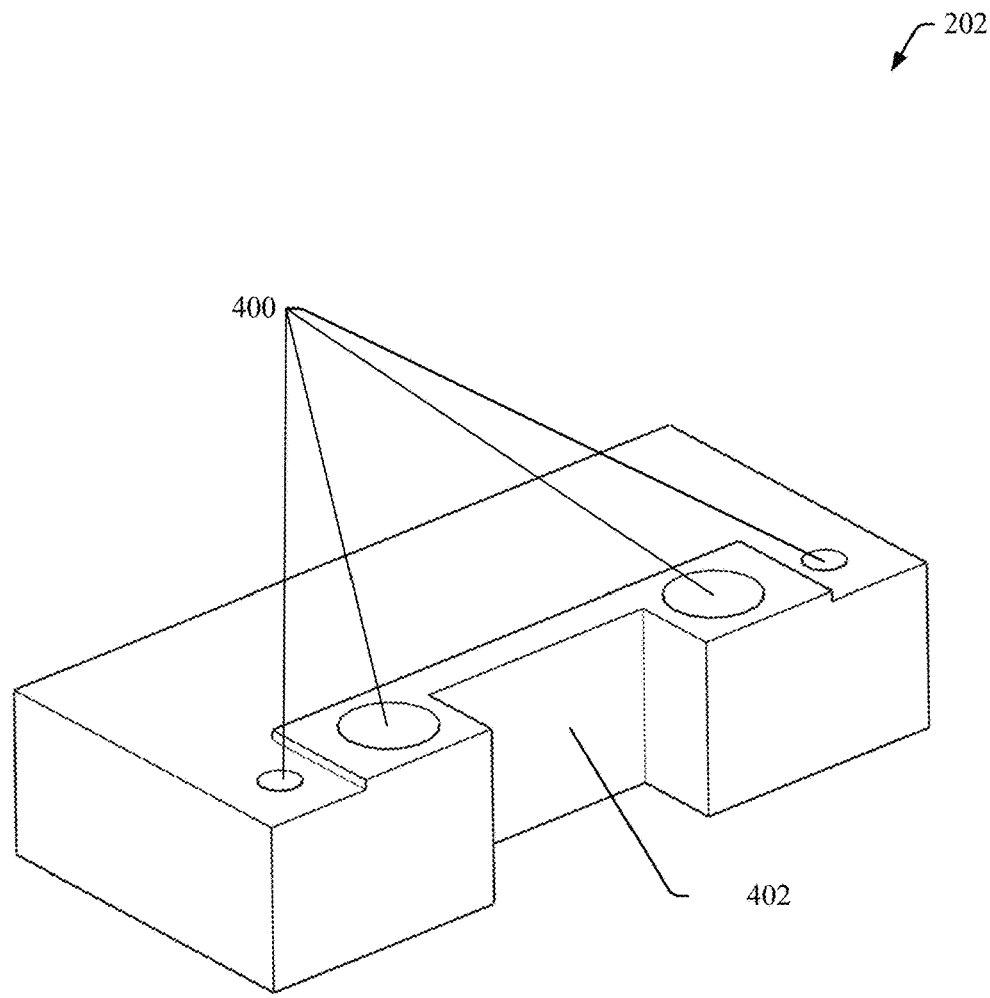
FIG. 4 illustrates, in accordance with this disclosure, an example lower clamp of the test fixture of FIG. 2.
Figure 4:
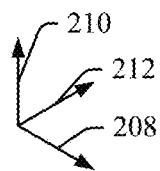

FIG. 4 illustrates an example of the bottom clamp 202 of FIG. 2. The bottom clamp 202 may be made of any material (e.g., metal, plastic) and may be formed and/or machined.

The bottom clamp 202 includes assembly features 400. The assembly features 400 are configured to secure the top clamp 200, the bottom clamp 202, and the shim 204 together as the test fixture 102-1. The assembly features 400 may include holes, slots, threads, pins, and/or latches. In the test fixture 102-1, the shim 204 is configured to interface with the bottom clamp 202. As such, the assembly features 302 may include a slot 402 such that a corresponding shape of the shim 204 can be placed in the slot 402. Doing so allows for different shims 204 to be utilized without having to adapt the bottom clamp 202.

Figure 5:
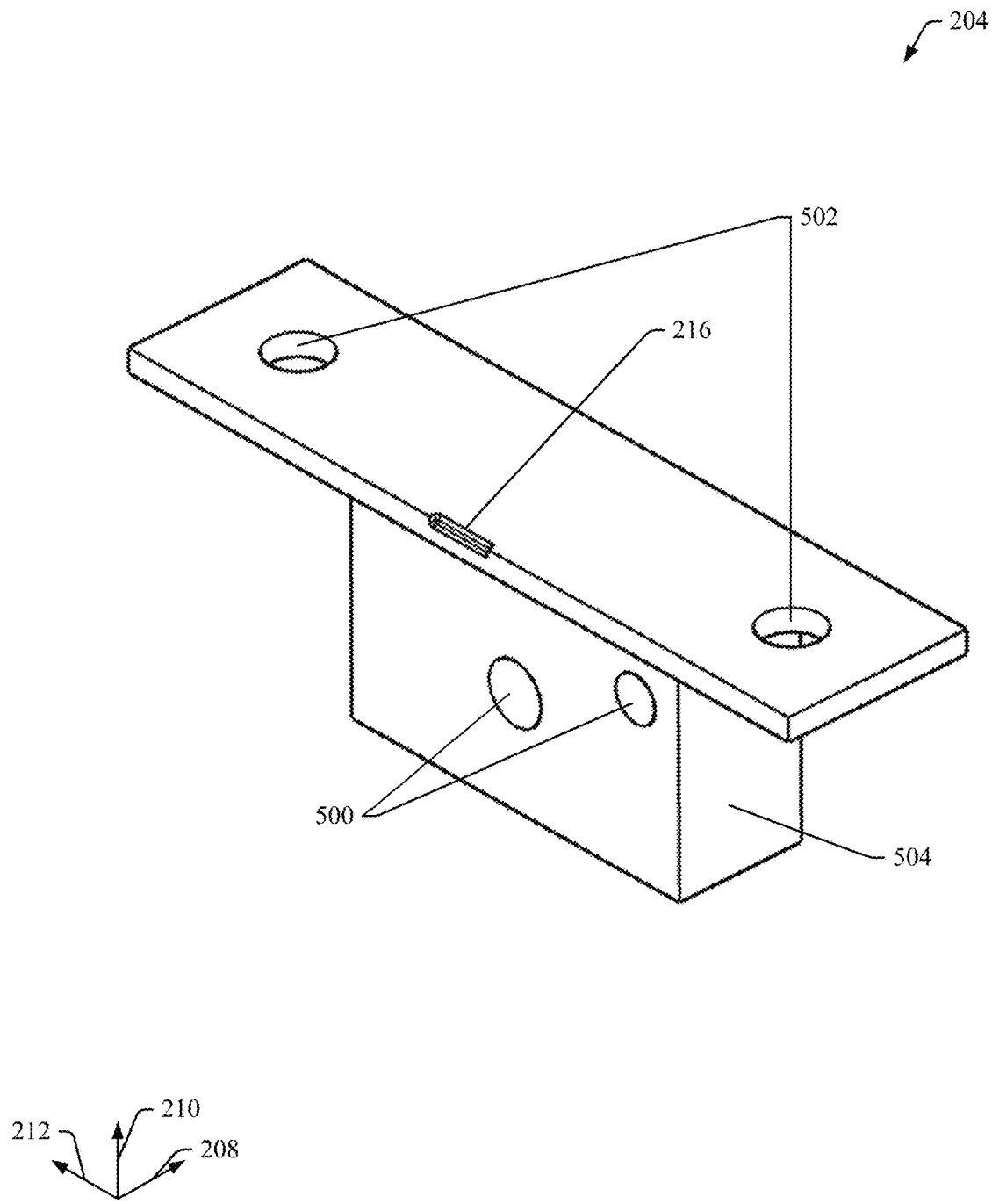
FIG. 5 illustrates, in accordance with this disclosure, an example shim of the test fixture of FIG. 2.

FIG. 5 illustrates an example of the shim 204 of FIG. 2. The shim 204 may be made of any conductive material (e.g., metal, conductive plastic) and may be formed and/or machined.

The shim 204 includes the aperture 216. As discussed above, the aperture 216 is configured to direct signals between the clamp interface 118-1 or 118-2 (e.g., from an end of the PCB 106-1 or 106-2) to the taper 214 of the top clamp 200. The aperture may be configured to direct the RF energy such that the RF energy enters the top clamp perpendicular to a normal axis of the end of the PCB. The length of the aperture 216 generally corresponds to the width of the taper 214 and the depth of the aperture 216 generally corresponds to a depth of a top layer of the PCB 106-1 or 106-2 (e.g., the antenna substrate layer).

The shim 204 includes sensor features 500 and assembly features 502. The sensor features 500 are configured to secure the sensor to the shim 204 (and thus, the test fixture 102-1) enabling the sensor to utilize the test port 120-1 for testing of the components. The sensor features 500 may include holes, slots, threads, pins, and/or latches. The assembly features 502 are configured to interface with the assembly features 400 and the assembly features 302 to secure the top clamp 200, the bottom clamp 202, and the shim 204 together as the test fixture 102-1. The assembly features 502 may include holes, slots, threads, pins, and/or latches.

The shim 204 also includes a protrusion 504 that is configured to interface with the slot 402 to support the shim 204 in the test fixture 102 as well as the sensor features 500.

The protrusion 504 includes the sensor features 500 such that a same mounting of the sensor can be used with different shims 204 regardless of the respective thicknesses of the locating end 218.

The configuration and/or design of the components discussed above may vary without departing from the scope of this disclosure. For example, the shim 204 may be integrated with the bottom clamp 202 thus, making a two-part assembly. Furthermore, features not specifically called out are not limited to the illustrated examples and may be any shape and/or size according to manufacturing requirements, hardware limitations, packaging, usability, ergonomics, etc.

Another Example Test Fixture

Figure 6:
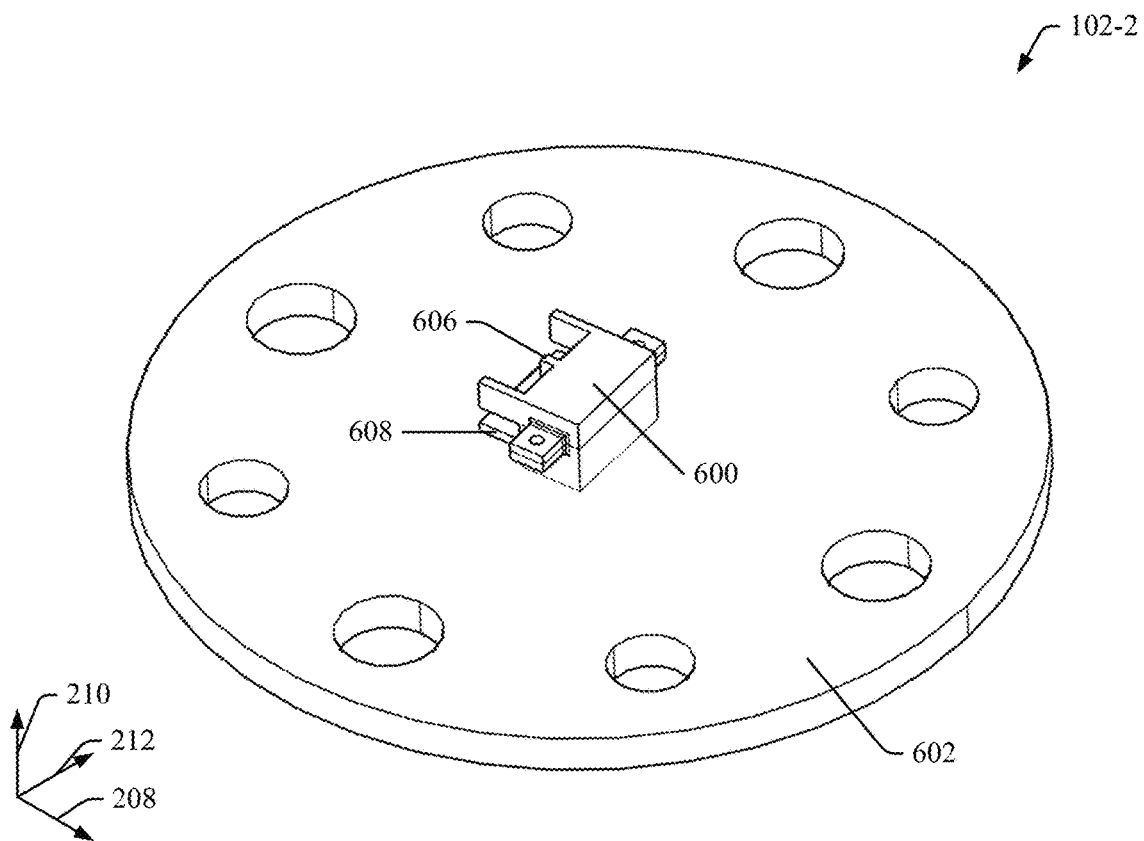
FIG. 6 illustrates, in accordance with this disclosure, another example test fixture for PCB components.
Figure 6:
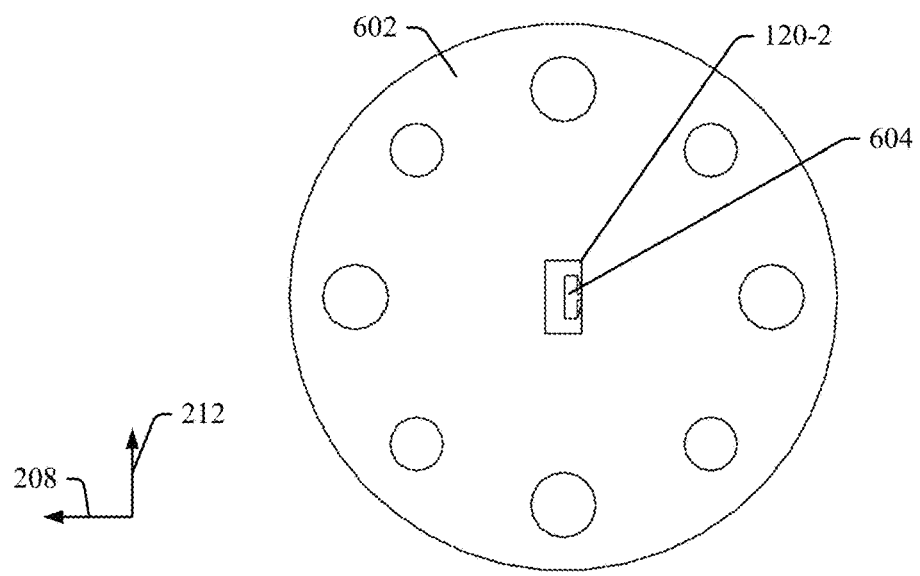

FIG. 6 illustrates another example of the test fixture 102 of FIG. 1 (e.g., test fixture 102-2) usable to test components of a PCB (e.g., RADAR components, RF transmission components). The test fixture 102-2 may be configured to test the same or different components from that of test fixture 102-1 (e.g., microstrips). The test fixture 102-2 includes a top clamp 600 and a bottom clamp 602. For reference, the same coordinate system 206 as that of test fixture 102-1 is shown.

The bottom clamp 602 includes the test port 120 (e.g., test port 120-2) facing a bottom side of the test fixture 102-2. The top clamp 600 includes a pyramidal probe 604 that connects a contact leg 606 to the test port 120-2. The contact leg 606 is configured to be in contact with the component under test (e.g., a microstrip).

Although not shown, the clamp interface 118 of the PCB 106 for use in the test fixture 102-2 (e.g., clamp interface 118-3 of PCB 106-3) may be along a cut line 108 through or adjacent to a microstrip of the parent PCB 104 (or of another parent PCB). The clamp interface 118-3 may be on a top of the PCB 106-3, rather than an end (e.g., for the SIW 112 of PCBs 106-1 and 106-2).

The PCB 106-3 may be aligned in the left/right axis 212 such that the clamp interface 118-3 is within a width of the contact leg 606. When the PCB 106 is placed in the test fixture 102-2, signals may be transmitted between the clamp interface 118-3 and the test port 120-2 via the pyramidal probe 604. The pyramidal probe is described in further detail in regard to FIG. 7.

In some implementations, a gasket material may be disposed between the PCB 106-3 and the bottom clamp 602 (e.g., on a shelf 608 of the bottom clamp 602). For example, the gasket material may be a compressible material (e.g., rubber, urethane, plastic). The gasket material may ensure a secure hold of the PCB 106-3 and/or accept variation in the thickness of the PCB 106-3 or tolerances of the top clamp 600. Furthermore, different thicknesses of gasket material may be used for different thicknesses of the PCB 106-3 (e.g., for testing different boards).

Other Example Components

Figure 7:
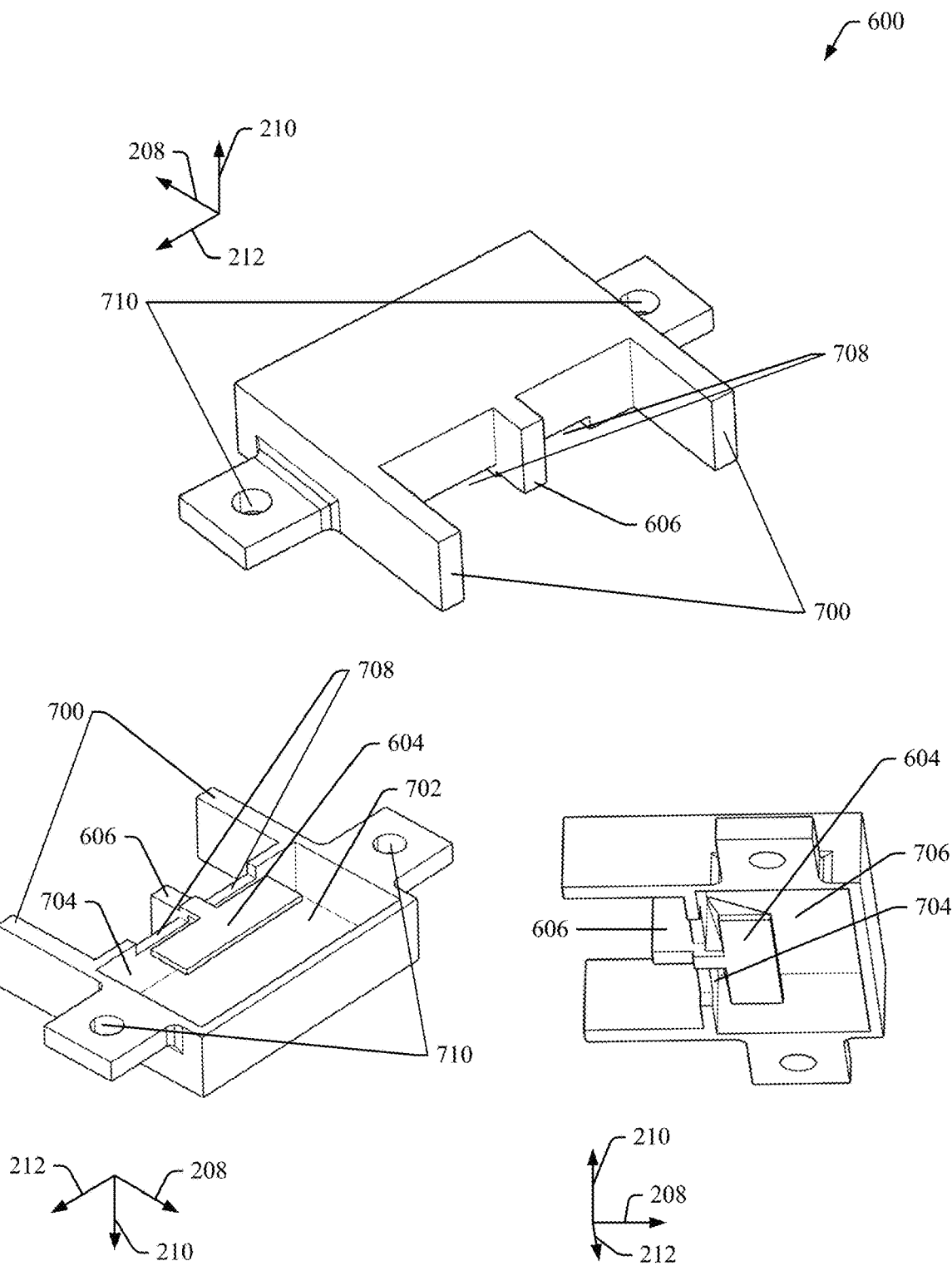
FIG. 7 illustrates, in accordance with this disclosure, an example top clamp of the test fixture of FIG. 6.

FIG. 7 illustrates an example of the top clamp 600 of FIG. 6. The top clamp 600 may be made of any conductive material (e.g., metal, conductive plastic) and may be formed and/or machined.

The top clamp 600 includes the pyramidal probe 604 and the contact leg 606 that are conductively coupled to one another. Adjacent to the contact leg 606 are clipping legs 700. The clipping legs 700 are configured to hold and secure the PCB 106-3 within the test fixture 102-2.

The top clamp 600 includes a cavity 702 surrounding the pyramidal probe 604. The cavity 702 may have dimensions corresponding to the test port 120-2 (e.g., WR10 waveguide interface, WRXX waveguide interface). The cavity 702 defines a front wall 704 and a top wall 706. The pyramidal probe 604 is connected to the front wall 704 without being connected to the top wall 706. In other words, the pyramidal probe 604 may be connected to the front wall 704 via an extension of the contact leg 606 and may not contact the top wall 706. For example, as illustrated, the contact leg 606 may partially extend into the cavity 702 (e.g., a bottom of the contact leg 606 extends into the cavity 702 while a top of the contact leg 606 does not). Doing so may allow the pyramidal probe 604 to "float" within the cavity 702 while still not contacting the top wall 706. The offset of the pyramidal probe from the front wall 704 (e.g., the slant) may be configured for best performance of the pyramidal probe 604 (e.g., to achieve good matching (S11) bandwidth at both the component (microstrip) and the test port 120-2). The bottom face of the pyramidal probe 604 may be flush with the bottom face of the top clamp 600.

The top clamp 600 also includes cutouts 708 that are configured to isolate the contact with the PCB 106-3 to the component (e.g., the microstrip). The top clamp also includes assembly features 710 that are configured to connect the top clamp 600 and the bottom clamp 602 around the PCB 106-3. The assembly features 502 may include holes, slots, threads, pins, and/or latches.

Figure 8:
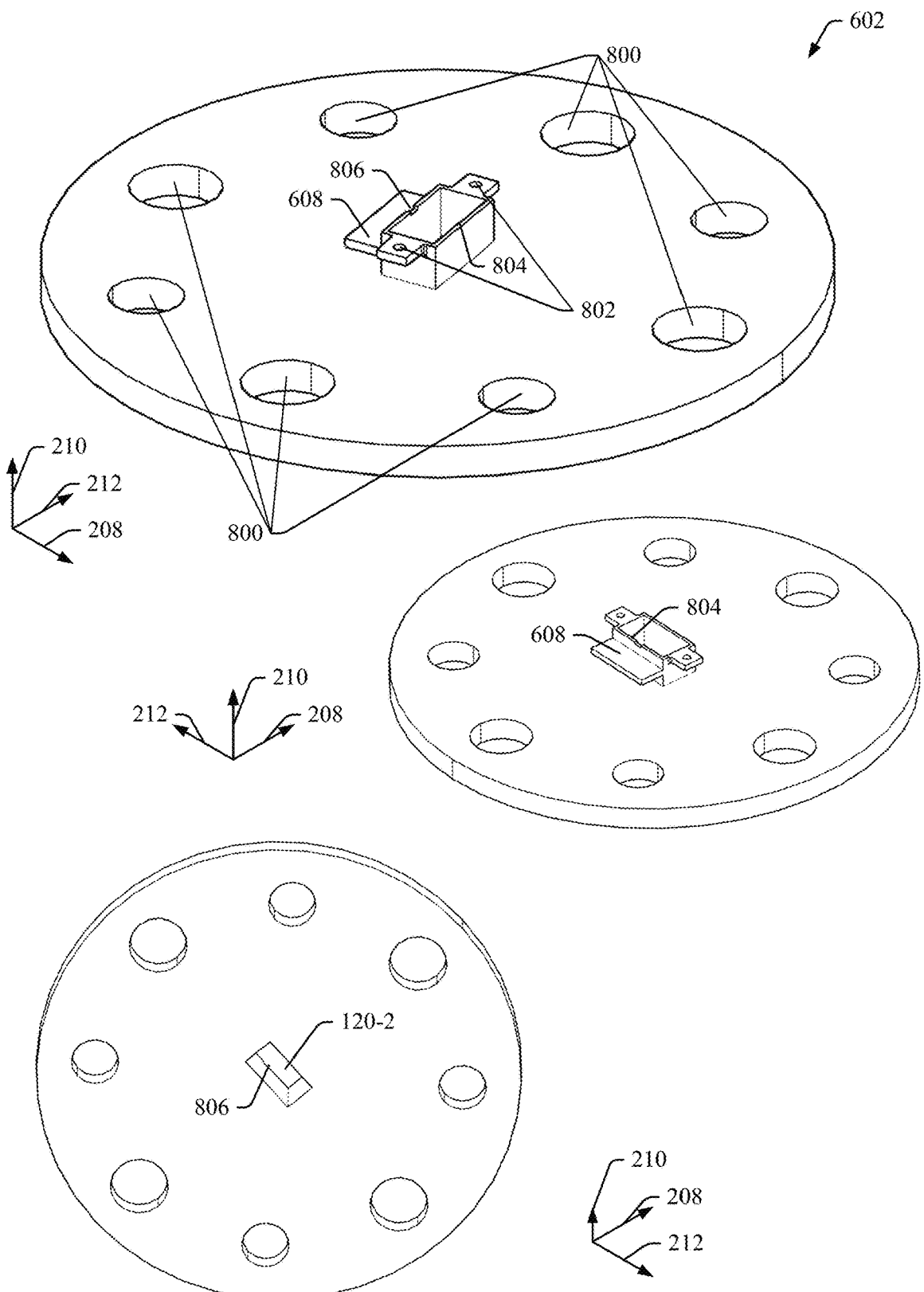
FIG. 8 illustrates, in accordance with this disclosure, an example lower clamp of the test fixture of FIG. 6.

FIG. 8 illustrates an example of the bottom clamp 602 of FIG. 6. The bottom clamp 602 may be made of any conductive material (e.g., metal, conductive plastic) and may be formed and/or machined. Furthermore, although shown as a single piece, the bottom clamp 602 may comprise multiple pieces without departing from the scope of this disclosure.

The bottom clamp 602 includes the test port 120-2. The test port 120-2 is configured such that the pyramidal probe 604 is aligned to the test port 120-1. The test port 120-2 may be a rectangular standard test port (e.g., a WR10 waveguide interface).

The bottom clamp 602 includes sensor features 800 and assembly features 802. The sensor features 800 are configured to secure a sensor or other device to the bottom clamp 602 (and thus, the test fixture 102-2) enabling the sensor to utilize the test port 120-2 for testing of the components. The sensor features 300 may include holes, slots, threads, pins, and/or latches depending upon a particular sensor and/or its mounting requirements (e.g., bolt pattern). The assembly features 802 are configured to secure the top clamp 600 to the bottom clamp 602 to make the test fixture 102-2. The assembly features 802 may include holes, slots, threads, pins, and/or latches.

The top of the test port 120-2 forms a mounting surface 804. The mounting surface 804 is configured to interface with the bottom face of the top clamp 600 (e.g., that surrounding the cavity 702). The bottom clamp 602 includes the shelf 608 that is offset from the mounting surface 804. The offset may correspond to a thickness of the PCB 106-3 with or without the gasket material. If a gasket material is used, then the offset may correspond to a thickness of the PCB 106-3 and the gasket material.

The bottom clamp 602 also includes a cutout 806 that is configured to isolate the contact with the PCB 106-3 to the component (e.g., the microstrip). The cutout 806 may be cut into the mounting surface 804 to provide a relief for the connection to the component.

Example PCB Provisions

Figure 9:
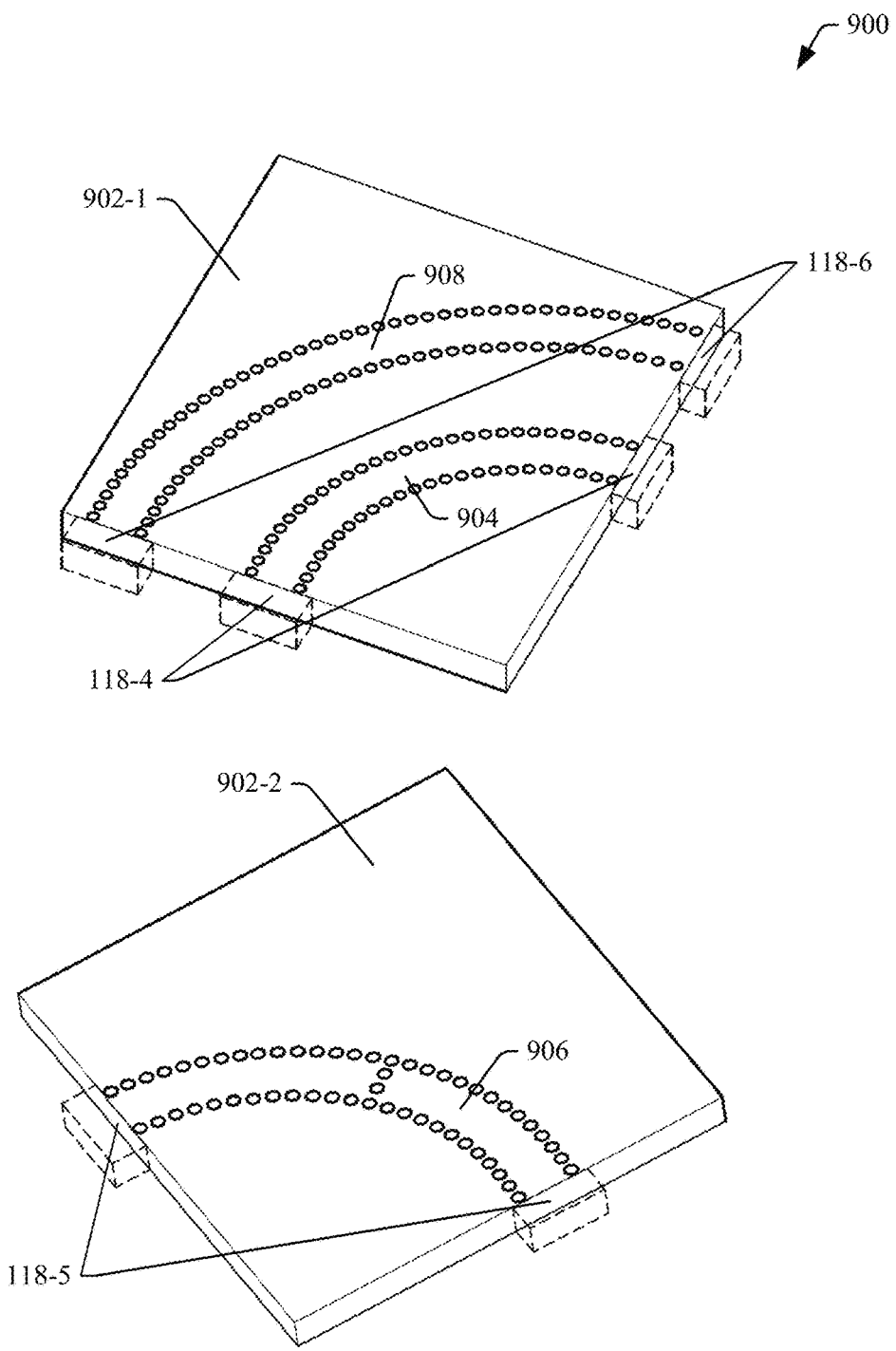
FIG. 9 illustrates, in accordance with this disclosure, example PCB provisions for testing using the test fixture of FIG. 2.

FIG. 9 illustrates, at 900, example of PCB provisions that may be used to further test components using the test fixture 102-1. The provisions may be used as a through-reflection-line (TRL) calibration standards for SIW. The calibration allows for mitigation of mismatch between the test fixture 102-1 and the PCB under test (e.g., PCB 106-1 or PCB 106-2).

FIG. 9 shows two corners 902 of the parent PCB 104 (e.g., corner 902-1 and corner 902-2). The corners 902 may be on any two corners of the parent PCB 104. The standards are laid out radially on the corners 902 such that the test fixture 102-1 can be used on both ends of the respective standards (e.g., two port calibration). Two test fixtures 102-1 may be used to test each of the standards (one on each port of a respective standard).

The standards comprise a through standard 904 on the corner 902-1 and a short standard 906 on the corner 902-2. The through standard 904 and the short standard 906 have a same radius. Adjacent to the through standard 904 is a line standard 908. The line standard 908 has a larger radius than the through standard 904 and the short standard 906 to achieve a delay in signal propagation. The standards generally comprise SIWs similar to SIW 112.

The standards have pairs of respective clamp interfaces 118. For example, the through standard 904 has clamp interfaces 118-4, the short standard 906 has clamp interfaces 118-118-5, and the line standard 908 has clamp interfaces 118-6.

Although not shown, an SIW stub resonator may be added to the through standard 904 and the line standard 908 to determine an effective permittivity of the SIW (and thus, the SIW 112). Similarly, an SIW to microstrip transition may be added to the parent PCB 104 for calibration of testing the microstrip in the test fixture 102-2. The SIW to microstrip transition may be usable to determine an effective permittivity of the substrate.

By using such provisions, the test fixture 102-1 may be used to characterize a substrate material of the parent PCB 104 (and thus, the PCB 106). Doing so allows for calibration of a specific parent PCB 104 (and not a generic parent PCB 104) that may lead to more accurate testing and characterization of the components.

Example Method

Figure 10:
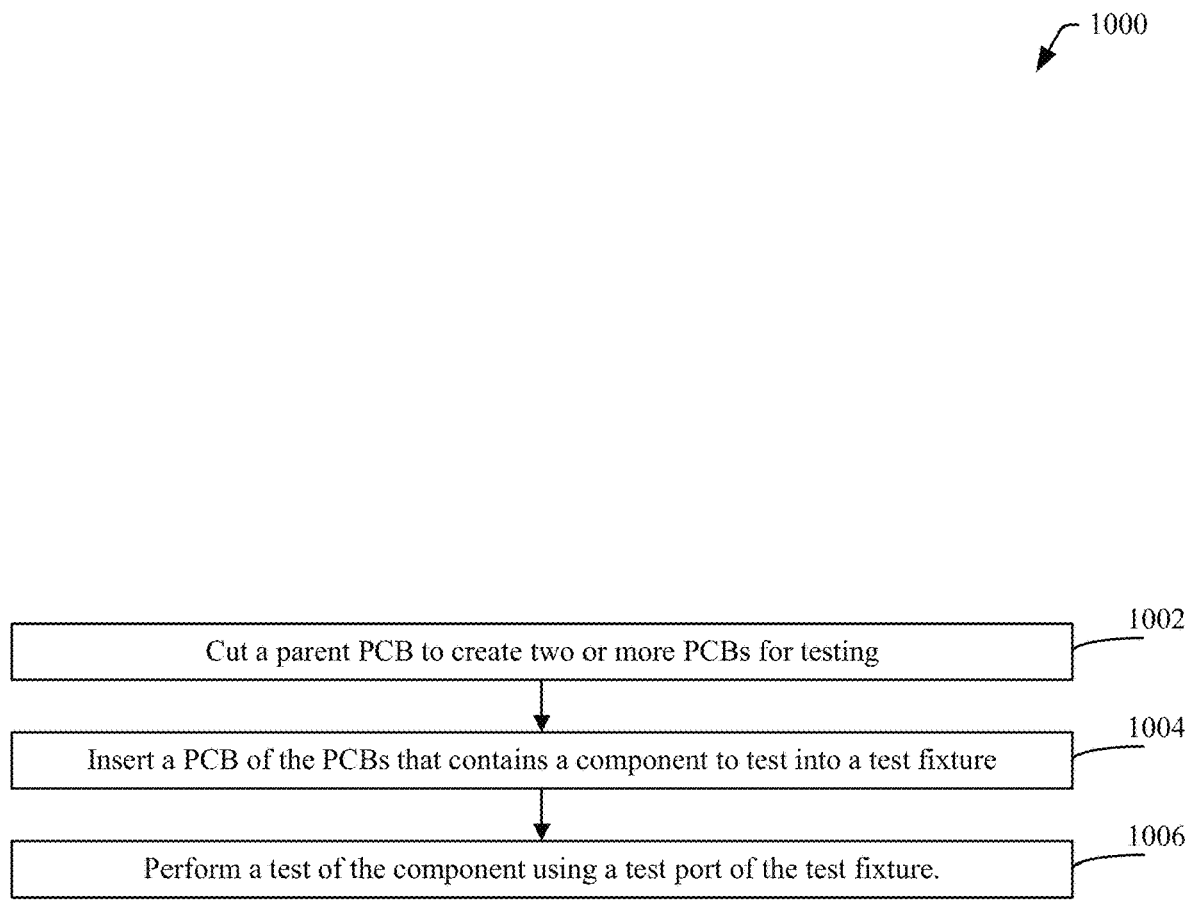
FIG. 10 illustrates, in accordance with this disclosure, an example method for testing a PCB using the test fixtures of FIGS. 2 and 6.

FIG. 10 illustrates, at 1000, an example method for testing a PCB using the test fixtures of FIGS. 2 and 6. The method may test at least one component of a parent PCB. At 1002, the parent PCB is cut to create two or more PCBs for testing. For example, the parent PCB 104 may be cut along the cut line 108 to create the PCBs 106-1, 106-2.

At 1004, one of the PCBs that contains the component is inserted into a test fixture. For example, the PCB 106-1 may be inserted into the test fixture 102-1 or the PCB 106-3 may be inserted into the test fixture 102-2. The test fixture 102-1 or the test fixture 102-2 may be disassembled, either partially or completely, to achieve the insertion.

If the test fixture 102-1 is used, the PCB 106-1 may be inserted such that the clamp interface 118-1 is against the shim 204 with the clamp interface 118-1 being within a length of the aperture 216. If the test fixture 102-2 is used, the PCB 106-3 may be inserted such that the PCB 106-3 is on the shelf 608 and the clamp interface 118-3 is proximate the cutout 806 (and thus, under the contact leg 606). The test fixture 102-1 or the test fixture 102-2 may then be assembled/clamped around the PCB 106-1 or the PCB 106-3.

At 1006, a test of the component is performed using a test port of the test fixture. For example, the computing system 122 may be connected to the test port 120-1 or the test port 120-2 to test the component of PCB 106-1 or the PCB 106-3.

EXAMPLES

Example 1: A test fixture configured to test at least one component of a printed circuit board (PCB), the test fixture comprising: a shim that provides an end having a thickness that corresponds to a thickness of the PCB proximal an end of the PCB, the end of the shim providing an aperture configured to direct RF energy from the component, via the end of the PCB, and to a top clamp of the test fixture; the top clamp that provides: a standard test port of the test fixture configured to test the component; and a taper configured to direct the RF energy from the aperture of the shim and to the standard test port; and a bottom clamp configured to be attached to the top clamp to retain the PCB between the top clamp and the bottom clamp for testing.

Example 2: The test fixture of example 1, wherein the component is a radar component.

Example 3: The test fixture of example 2, wherein the radar component comprises a substrate integrated waveguide (SIW).

Example 4: The test fixture of example 2, wherein the radar component comprises a monolithic microwave integrated circuit (MMIC).

Example 5: The test fixture of example 2, wherein the radar component comprises an antenna.

Example 6: The test fixture of any preceding example, wherein: the test fixture is configured for destructive testing of a parent PCB; the PCB is a portion of the parent PCB; and the end of the PCB corresponds to a cut line of the parent PCB.

Example 7: The test fixture of example 6, wherein the cut line is between a substrate integrated waveguide (SIW) and antenna of the parent PCB.

Example 8: The test fixture of any preceding example, wherein a depth of the aperture in the end of the shim corresponds to a depth of a top layer of the PCB.

Example 9: The test fixture of example 8, wherein the top layer comprises an antenna substrate layer.

Example 10: The test fixture of any preceding example, wherein the standard test port is a standard rectangular waveguide interface.

Example 11: The test fixture of example 10, wherein the standard test port is a WR12 waveguide interface.

Example 12: The test fixture of any preceding example, wherein the standard test port is parallel to a normal axis of the end of the PCB.

Example 13: The test fixture of any preceding example, wherein the aperture is configured to direct the RF energy such that the RF energy enters the top clamp perpendicular to a normal axis of the end of the PCB.

Example 14: The test fixture of any preceding example, wherein an angle or length of the taper corresponds to a bandwidth of the component.

Example 15: The test fixture of any preceding example, wherein the taper and the standard test port form a cavity along an edge of the top clamp.

Example 16: The test fixture of any preceding example, wherein the shim is configured to: be attached to either the top clamp or the bottom clamp; and locate the end of the PCB relative to the taper.

Example 17: The test fixture of any preceding example, wherein the taper covers the aperture when the shim, the top clamp, and the bottom clamp are assembled around the PCB.

Example 18: The test fixture of any preceding example, wherein the shim is attached to the bottom clamp.

Example 19: The test fixture of any preceding example, wherein the shim, the top clamp, and the bottom clamp are made of a conductive material.

Example 20: The test fixture of any preceding example, wherein the test fixture further comprises gasket material configured to secure the PCB within the test fixture for testing and to provide for variation in the thickness of the PCB or variation in the thickness of the end of the shim.

Example 21: A test fixture configured to test at least one component of a printed circuit board (PCB), the test fixture comprising: a top clamp that provides: a contact leg configured to contact the component; and a pyramidal probe connected to the contact leg and configured to provide RF energy from the component, via the contact leg and the pyramidal probe, to a standard test port of the test fixture; and a bottom clamp configured to be attached to the top clamp to retain the PCB between the top clamp and the bottom clamp for testing, the bottom clamp providing: the standard test port; and a shelf for supporting the PCB in the test fixture.

Example 22: The test fixture of example 21, wherein the component is a radar component.

Example 23: The test fixture of example 21 or 22, wherein the component comprises a microstrip.

Example 24: The test fixture of any of examples 21 to 23, wherein the component comprises a microstrip transition.

Example 25: The test fixture of example 24, wherein the transition is a substrate integrated waveguide (SIW) to microstrip transition.

Example 26: The test fixture of any of examples 21 to 25, wherein: the test fixture is configured for destructive testing of a parent PCB; the PCB is a portion of the parent PCB; and the PCB corresponds to a cut line of the parent PCB.

Example 27: The test fixture of example 26, wherein the cut line is through or adjacent to a microstrip.

Example 28: The test fixture of any of examples 21 to 27, wherein an offset between the shelf of the bottom fixture and a mounting surface of the bottom fixture configured to interface with the top fixture corresponds to a depth of the PCB.

Example 29: The test fixture of any of examples 21 to 28, wherein the top fixture further provides clipping legs configured to support the PCB in the test fixture.

Example 30: The test fixture of any of examples 21 to 29, wherein the standard test port is a standard rectangular waveguide interface.

Example 31: The test fixture of example 30, wherein the standard test port is a WR10 waveguide interface.

Example 32: The test fixture of any of examples 21 to 31, wherein the standard test port is parallel to a normal axis of a plane of the PCB.

Example 33: The test fixture of any of examples 21 to 32, wherein the pyramidal probe does not contact a top wall of the top clamp.

Example 34: The test fixture of any of examples 21 to 33, wherein a shape of the pyramidal probe corresponds to a bandwidth of the components.

Example 35: The test fixture of any of examples 21 to 34, wherein the pyramidal probe is smaller than the standard test port.

Example 36: The test fixture of any of examples 21 to 35, further comprising a gasket material disposed on the shelf.

Example 37: The test fixture of example 36, wherein a thickness of the gasket material corresponds to a thickness of the PCB.

Example 38: The test fixture of example 37, wherein the thickness of the gasket provides for contact of the contact leg to the component when the test fixture is assembled around the PCB.

Example 39: The test fixture of any of examples 36 to 38, wherein the gasket material is compressible.

Example 40: The test fixture of any preceding example, wherein the pyramidal probe is connected to a front wall of the top clamp via an extension of the contact leg into a cavity of the top clamp.

Example 41: A method of testing at least one component of a parent printed circuit board (PCB), the method comprising: cutting the parent PCB to create two or more PCBs for testing; inserting a PCB of the PCBs that contains the component into a test fixture according to any of the preceding examples; and performing a test of the component using a test port of the test fixture.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims.

The use of "or" and grammatically related terms indicates non-exclusive alternatives without limitation unless the context clearly dictates otherwise. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

What is claimed is:

1. A test fixture configured to test at least one component of a printed circuit board (PCB), the test fixture comprising:
   a shim portion that provides an end having an aperture configured to direct radio frequency (RF) energy from or to the component, via the end of the PCB, and to or from a top clamp of the test fixture; and
   the top clamp that provides:
      a test port of the test fixture configured to test the component; and
      a transition portion configured to direct the RF energy from or to the aperture of the shim portion and to or from the test port,
   wherein the shim portion at least one of separates and is disposed between a plurality of clamps of the test fixture, the plurality of clamps including the top clamp.

2. The test fixture of claim 1, wherein the component is a radar component.

3. The test fixture of claim 2, wherein the radar component comprises a substrate integrated waveguide (SIW), a monolithic microwave integrated circuit (MMIC), an antenna, or a ball grid array (BGA) to SIW transition.

4. The test fixture of claim 1, wherein the aperture is centered relative to the transition portion in a left/right axis.

5. The test fixture of claim 1, wherein the transition portion covers the aperture in a top/bottom axis.

6. The test fixture of claim 1, wherein:
   the test fixture is configured for destructive testing of a parent PCB;
   the PCB is a portion of the parent PCB; and
   the end of the PCB corresponds to a cut line of the parent PCB.

7. The test fixture of claim 6, wherein the cut line is between a substrate integrated waveguide (SIW) and antenna of the parent PCB.

8. The test fixture of claim 1, wherein a depth of the aperture in the end of the shim portion corresponds to a depth of a top layer of the PCB.

9. The test fixture of claim 8, wherein the top layer comprises an antenna substrate layer.

10. The test fixture of claim 1, wherein the test port is a standard rectangular waveguide interface.

11. The test fixture of claim 1, wherein the test port is parallel to the end of the PCB.

12. The test fixture of claim 1, wherein the aperture is configured to direct the RF energy such that the RF energy enters the top clamp perpendicular to the end of the PCB.

13. The test fixture of claim 1, wherein an angle or length of the transition portion corresponds to a bandwidth of the component.

14. The test fixture of claim 1, wherein the transition portion and the standard test port form a cavity along a surface of the top clamp.

15. The test fixture of claim 1, wherein:
   the shim portion is attached to the top clamp or a bottom clamp of the test fixture; and
   the plurality of clamps comprise the bottom clamp.

16. The test fixture of claim 1, wherein a thickness of the shim portion matches a thickness of the PCB.

17. The test fixture of claim 1, wherein the test port is configured as a waveguide interface comprising a tapered surface configured to direct the RF energy from or to the aperture of the shim portion.

18. The test fixture of claim 1, wherein the test port is a cavity defined by the top clamp and the shim portion.

19. A test fixture configured to test at least one component of a printed circuit board (PCB), the test fixture comprising a top portion clamp that comprises:
   a contact leg portion configured to contact the component; and
   a pyramidal probe connected to the contact leg portion and configured to provide RF energy from or to the component via the contact leg portion and to or from a test port of the test fixture, wherein the pyramidal probe is a prism-shaped contact that is at least one of disposed in and floats in a cavity of the top clamp and contacts the contact leg portion.

20. The test fixture of claim 19, wherein the component comprises a microstrip.

21. The test fixture of claim 19, wherein:
   the pyramidal probe is connected to a front wall of the top clamp via an extension of the contact leg portion into the cavity of the top clamp; and
   the pyramidal probe does not contact a top wall of the top clamp.

22. The test fixture of claim 19, wherein the contact leg portion is wider than the component.

23. The test fixture of claim 19, wherein the test port is disposed within a bottom portion of the test fixture.

24. The test fixture of claim 19, wherein the pyramidal probe does not contact side surfaces of the top clamp and a bottom clamp but rather contacts and is held by the contact leg portion.

25. The test fixture of claim 19, wherein the pyramidal probe is disposed in the cavity of the top clamp and contacts the contact leg portion.

26. The test fixture of claim 19, wherein:
   the pyramidal probe is configured to provide radio frequency energy from the component and the contact leg portion to the test port of the test fixture; and
   the test port is configured as a waveguide interface and has dimensions matching dimensions of the top clamp.

27. The test fixture of claim 19, further comprising a bottom clamp comprising the test port and a shelf configured to support the PCB.

\* \* \* \* \*

UNITED STATES PATENT AND TRADEMARK OFFICE
CERTIFICATE OF CORRECTION

| | | |
|---|---|---|
| PATENT NO. | : 12,153,083 B2 | Page 1 of 1 |
| APPLICATION NO. | : 18/306214 | |
| DATED | : November 26, 2024 | |
| INVENTOR(S) | : Biswadeep Das Gupta et al. | |

It is certified that error appears in the above-identified patent and that said Letters Patent is hereby corrected as shown below:

In the Claims

Column 12, Claim 14, Line 32: before "test", delete "standard"

Column 12, Claim 19, Line 48: after "top", delete "portion"

Signed and Sealed this
Fifteenth Day of April, 2025

Coke Morgan Stewart
*Acting Director of the United States Patent and Trademark Office*